(12) United States Patent
Fujimura et al.

(10) Patent No.: US 10,759,678 B2
(45) Date of Patent: Sep. 1, 2020

(54) DILUTE CHEMICAL SOLUTION PRODUCING APPARATUS AND DILUTE CHEMICAL SOLUTION PRODUCING METHOD

(71) Applicant: KURITA WATER INDUSTRIES LTD., Tokyo (JP)

(72) Inventors: Yu Fujimura, Tokyo (JP); Nobuko Gan, Tokyo (JP); Hiroto Tokoshima, Tokyo (JP)

(73) Assignee: KURITA WATER INDUSTRIES LTD., Tokyo (JP)

( * ) Notice: Subject to any disclaimer, the term of this patent is extended or adjusted under 35 U.S.C. 154(b) by 0 days.

(21) Appl. No.: 16/313,245

(22) PCT Filed: Mar. 14, 2017

(86) PCT No.: PCT/JP2017/010275
§ 371 (c)(1),
(2) Date: Dec. 26, 2018

(87) PCT Pub. No.: WO2018/055801
PCT Pub. Date: Mar. 29, 2018

(65) Prior Publication Data
US 2019/0233307 A1 Aug. 1, 2019

(30) Foreign Application Priority Data
Sep. 20, 2016 (JP) .................. 2016-183087

(51) Int. Cl.
*C02F 1/20* (2006.01)
*C02F 1/68* (2006.01)
(Continued)

(52) U.S. Cl.
CPC ............ *C02F 1/20* (2013.01); *B01D 19/0005* (2013.01); *B01D 19/0031* (2013.01);
(Continued)

(58) Field of Classification Search
CPC ...... C02F 1/20; C02F 1/58; C02F 1/06; C02F 1/44; C02F 1/444; C02F 1/68;
(Continued)

(56) References Cited

U.S. PATENT DOCUMENTS

| 2004/0227345 | A1 | 11/2004 | Okamoto et al. |
| 2009/0127201 | A1* | 5/2009 | Kobayashi ............... B01J 31/08 |
| | | | 210/668 |
| 2016/0233082 | A1 | 8/2016 | Yano et al. |

FOREIGN PATENT DOCUMENTS

| JP | H04-176303 A | 6/1992 |
| JP | H07-312359 A | 11/1995 |

(Continued)

OTHER PUBLICATIONS

Machine translation of JP 2004-296463 A, which was published on Oct. 21, 2004 (Year: 2004).*

(Continued)

*Primary Examiner* — Natasha E Young
(74) *Attorney, Agent, or Firm* — Posz Law Group, PLC

(57) ABSTRACT

A dilute chemical solution producing apparatus includes, in a supply line of ultrapure water, a platinum group metal carrying resin column, a membrane-type deaeration apparatus, and a gas dissolving membrane apparatus, and a washing chemical solution injection apparatus is provided between the platinum group metal carrying resin column and the membrane-type deaeration apparatus. An inert gas source is connected to a gas phase side of the membrane-type deaeration apparatus, and an inert gas source is also connected to a gas phase side of the gas dissolving membrane apparatus. A discharge line communicates with the gas dissolving membrane apparatus. With such a dilute chemical solution producing apparatus, a dilute chemical solution with both dissolved oxygen and dissolved hydrogen perox- (Continued)

ide being removed can be safely produced and supplied in a washing step for semiconductor washing.

6 Claims, 1 Drawing Sheet

(51) Int. Cl.
<table>
<tr><td>C02F 1/44</td><td>(2006.01)</td></tr>
<tr><td>B01D 19/00</td><td>(2006.01)</td></tr>
<tr><td>B01J 23/42</td><td>(2006.01)</td></tr>
<tr><td>H01L 21/02</td><td>(2006.01)</td></tr>
<tr><td>H01L 21/30</td><td>(2006.01)</td></tr>
<tr><td>G03F 1/82</td><td>(2012.01)</td></tr>
<tr><td>B08B 3/08</td><td>(2006.01)</td></tr>
<tr><td>B01F 1/00</td><td>(2006.01)</td></tr>
<tr><td>B01F 5/06</td><td>(2006.01)</td></tr>
<tr><td>C02F 1/58</td><td>(2006.01)</td></tr>
<tr><td>H01L 21/304</td><td>(2006.01)</td></tr>
<tr><td>C02F 103/04</td><td>(2006.01)</td></tr>
</table>

(52) U.S. Cl.
CPC ..... *B01D 19/0036* (2013.01); *B01D 19/0068* (2013.01); *B01F 1/00* (2013.01); *B01F 5/06* (2013.01); *B01J 23/42* (2013.01); *B08B 3/08* (2013.01); *C02F 1/58* (2013.01); *C02F 1/68* (2013.01); *G03F 1/82* (2013.01); *H01L 21/02052* (2013.01); *H01L 21/304* (2013.01); *C02F 1/444* (2013.01); *C02F 2103/04* (2013.01)

(58) Field of Classification Search
CPC .............. C02F 2103/00; C02F 2103/02; C02F 2103/04; B01D 19/0031; B01D 19/0068; B01D 19/00; B01D 19/0005; B01D 19/001; B01D 19/0015; B01D 19/0036; B01F 1/00; B01F 5/00; B01F 5/06; B01J 23/00; B01J 23/38; B01J 23/40; B01J 23/42; B08B 3/00; B08B 3/04; B08B 3/08; G03F 1/00; G03F 1/68; G03F 1/82; H01L 21/00; H01L 21/02; H01L 21/02041; H01L 21/02043; H01L 21/02052; H01L 21/04; H01L 21/18; H01L 21/30; H01L 21/302; H01L 21/304
See application file for complete search history.

(56) References Cited

FOREIGN PATENT DOCUMENTS

<table>
<tr><td>JP</td><td>H08-337296 A</td><td></td><td>12/1996</td></tr>
<tr><td>JP</td><td>H09-094447 A</td><td></td><td>4/1997</td></tr>
<tr><td>JP</td><td>2000-208471 A</td><td></td><td>7/2000</td></tr>
<tr><td>JP</td><td>2002-307080 A</td><td></td><td>10/2002</td></tr>
<tr><td>JP</td><td>2003-062403 A</td><td></td><td>3/2003</td></tr>
<tr><td>JP</td><td>2004296463 A</td><td>*</td><td>10/2004</td></tr>
<tr><td>JP</td><td>2004-340304 A</td><td></td><td>12/2004</td></tr>
<tr><td>JP</td><td>2010-069460 A</td><td></td><td>4/2010</td></tr>
<tr><td>JP</td><td>2011-036807 A</td><td></td><td>2/2011</td></tr>
<tr><td>JP</td><td>2015-088740 A</td><td></td><td>5/2015</td></tr>
<tr><td>WO</td><td>2015/189933 A1</td><td></td><td>12/2015</td></tr>
</table>

OTHER PUBLICATIONS

International Search Report dated Apr. 18, 2017 issued in corresponding international patent application No. PCT/JP2017/010275 (and English translation).

* cited by examiner

DILUTE CHEMICAL SOLUTION PRODUCING APPARATUS AND DILUTE CHEMICAL SOLUTION PRODUCING METHOD

CROSS REFERENCE TO RELATED APPLICATIONS

This application is a U.S. national stage application of PCT/JP2017/010275, now WO 2018/055801, filed on Mar. 14, 2017, and is based on Japanese Patent Application No. 2016-183087 filed on Sep. 20, 2016, the contents of which are incorporated herein by reference.

TECHNICAL FIELD

The present invention relates to an apparatus and a method for producing a dilute chemical solution used in the field of the electronic industry and the like, and particularly to an apparatus and a method for producing a high-purity dilute chemical solution without any harmful effect due to dissolved gas and the like in a washing chemical solution.

BACKGROUND ART

Electronic materials such as a semiconductor silicon substrate, a liquid crystal glass substrate, or a photomask quartz substrate require highly cleaned surfaces, and wet washing has been performed by various methods using a high-purity dilute chemical solution obtained by diluting a predetermined chemical solution with ultrapure water. In this case, air bubbles may enter the supplied ultrapure water to cause various troubles. For example, in a lithography process of applying a resist to a thin film laminated on a semiconductor wafer, exposing the resist through a mask formed with a pattern, and performing developing and then etching to form the pattern on the thin film, spin coating of the semiconductor wafer with a resist liquid or a development liquid containing air bubbles causes troubles such as a pattern defect due to uneven treatment.

For this reason, various washing methods for preventing air bubbles from entering a dilute chemical solution are disclosed. Patent Document 1 discloses a method for producing a washing chemical solution in which in order to reduce dissolved oxygen in a dilute hydrofluoric acid aqueous solution used in a semiconductor washing step, the dilute hydrofluoric acid aqueous solution is diluted with pure water with a dissolved oxygen content of 10 ppm or less, and most of gas in contact with the dilute hydrofluoric acid aqueous solution in the washing step is rendered inert at room temperature (a volume ratio of oxygen of 21% or less) to prevent an increase in dissolved oxygen in the dilute hydrofluoric acid. Patent Documents 2 and 3 disclose technologies in which in order to reduce dissolved gaseous species in a chemical solution, deaeration means using a vacuum pump is provided in a chemical solution storage tank or a line for conveying the chemical solution to perform deaeration, thereby preventing dissolution of the dissolved gaseous species in the chemical solution.

PRIOR ART DOCUMENT

Patent Document

[Patent Document 1] JPH7-312359A
[Patent Document 2] JPH8-337296A
[Patent Document 3] JPH9-94447A

SUMMARY OF THE INVENTION

Problems to be Solved by the Invention

It has been found that with recent miniaturization of semiconductors, a trace of dissolved oxygen or dissolved hydrogen peroxide (on the order of ppb) contained in a washing solution deteriorates electrical properties or reliability of semiconductors to be washed. Thus, as described in Patent Document 1, the dilution with pure water with a dissolved oxygen content of 10 ppm or less is unsuitable for surface washing in the current semiconductor manufacturing process. Further, dissolved oxygen originally contained in a hydrofluoric acid aqueous solution that is an undiluted washing chemical solution cannot be removed.

In the technologies in Patent Documents 2 and 3, vacuum deaeration is performed to remove dissolved gaseous species in a chemical solution in a chemical solution dilution step, and thus the dissolved gaseous species in a dilute chemical solution can be significantly reduced. However, in Patent Documents 2 and 3, although a vacuum pump is provided in a chemical solution storage tank or a line for conveying a chemical solution to reduce the dissolved gaseous species in the chemical solution, using the vacuum pump to deaerate a chemical solution of a toxic substance such as hydrofluoric acid and ammonia used for washing a semiconductor surface requires changing the vacuum pump to have chemical resistance and hydrofluoric acid resistance. Also, mist of the chemical solution of the toxic substance diffuses to cause a risk of leakage of the chemical solution or the like.

Further, for the dilute chemical solution produced by any technologies in Patent Documents 1 to 3, it is difficult to remove a trace of hydrogen peroxide contained in the dilute chemical solution, and the trace of hydrogen peroxide may have a harmful effect on washing of an electronic material. As a measure to counter this, it is considered to remove hydrogen peroxide in ultrapure water using a hydrogen peroxide removing catalyst having a carrier for carrying platinum group metal fine particles. However, decomposing hydrogen peroxide with platinum group metal generates oxygen due to a catalyst reaction, resulting in increased dissolved oxygen in the ultrapure water.

The present invention has been made in view of the above problems and an object of the present invention is to provide a producing apparatus and a producing method capable of safely producing and supplying a high-purity dilute chemical solution with both dissolved oxygen and dissolved hydrogen peroxide being removed in a washing step for semiconductor washing.

Means for Solving the Problems

To achieve the above object, the present invention first provides a dilute chemical solution producing apparatus for diluting a chemical solution with ultrapure water, sequentially including, in an ultrapure water supply line, a platinum group metal carrying resin column and a membrane-type deaeration apparatus, a chemical solution injection apparatus being provided between the platinum group metal carrying resin column and the membrane-type deaeration apparatus (Invention 1).

According to the above invention (Invention 1), the ultrapure water is passed through the platinum group metal carrying resin column from the ultrapure water supply line to remove a trace of hydrogen peroxide contained in the ultrapure water, then a chemical solution is injected from the chemical solution injection apparatus to prepare a dilute chemical solution, and then the dilute chemical solution is deaerated by the membrane-type deaeration apparatus to remove dissolved oxygen in the dilute chemical solution. Thus, a cleaned high-purity dilute chemical solution with both dissolved oxygen and dissolved hydrogen peroxide being sufficiently reduced can be safely produced and supplied.

In the above invention (Invention 1), an inert gas dissolving membrane apparatus is preferably provided downstream of the membrane-type deaeration apparatus (Invention 2).

According to the above invention (Invention 2), an inert gas is dissolved in the high-purity dilute chemical solution so that a gas component is hardly dissolved in the dilute chemical solution, thereby maintaining high purity.

In the above inventions (Inventions 1 and 2), the membrane-type deaeration apparatus is preferably of an inert gas suction type (Invention 3).

According to the above invention (Invention 3), the inert gas is sucked into a gas phase side of the membrane-type deaeration apparatus and the dilute chemical solution is supplied to a liquid phase side thereof to effectively remove a dissolved gas such as dissolved oxygen, thereby further reducing a dissolved oxygen concentration of the obtained dilute chemical solution.

Also, the present invention secondly provides a dilute chemical solution producing method for diluting a chemical solution with ultrapure water, wherein the ultrapure water for dilution is passed through a platinum group metal carrying resin column, then a chemical solution component is added to prepare a dilute chemical solution, and then the obtained dilute chemical solution is deaerated (Invention 4).

According to the above invention (Invention 4), the ultrapure water is passed through the platinum group metal carrying resin column to remove a trace of hydrogen peroxide contained in the ultrapure water, then the chemical solution component is added from a chemical solution injection apparatus to prepare a dilute chemical solution, and then the dilute chemical solution is deaerated to remove dissolved oxygen in the dilute chemical solution. Thus, a high-purity dilute chemical solution with both dissolved oxygen and dissolved hydrogen peroxide being sufficiently reduced can be safely produced and supplied.

In the above invention (Invention 4), an inert gas is preferably dissolved in the deaerated dilute chemical solution (Invention 5).

According to the above invention (Invention 5), the inert gas is dissolved in the high-purity dilute chemical solution so that a gas component is hardly dissolved in the dilute chemical solution, thereby maintaining high purity.

In the above inventions (Inventions 4 and 5), the deaeration is preferably performed while the inert gas is sucked into a gas phase side (Invention 6).

According to the above invention (Invention 6), the inert gas is sucked into a gas phase side of a membrane-type deaeration apparatus and the dilute chemical solution is supplied to a liquid phase side thereof to effectively remove a dissolved gas such as dissolved oxygen, thereby further reducing a dissolved oxygen concentration of the obtained dilute chemical solution.

Effect of the Invention

According to the dilute chemical solution producing apparatus of the present invention, the trace of hydrogen peroxide contained in the ultrapure water is first removed by the platinum group metal carrying resin column, then the chemical solution is injected from the chemical solution injection apparatus to prepare the dilute chemical solution, and then the dilute chemical solution is deaerated by the membrane-type deaeration apparatus to remove dissolved oxygen in the dilute chemical solution. Thus, a high-purity dilute chemical solution with both dissolved oxygen and dissolved hydrogen peroxide being sufficiently reduced can be supplied, and a harmful effect of the dilute chemical solution on washing of an electronic material can be eliminated.

EMBODIMENT FOR CARRYING OUT THE INVENTION

Hereinafter, an embodiment of a dilute chemical solution producing apparatus of the present invention will be described in detail with reference to the accompanying drawings.

[Dilute Chemical Solution Producing Apparatus]

Figure 1:
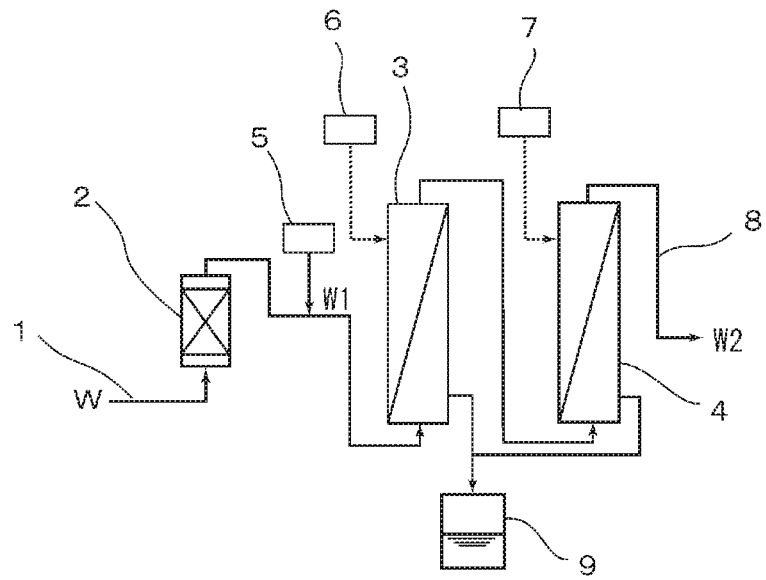
FIG. 1 is a schematic view of a dilute chemical solution producing apparatus according to an embodiment of the present invention.

FIG. 1 shows a dilute chemical solution producing apparatus of this embodiment. In FIG. 1, the dilute chemical solution producing apparatus sequentially includes, in a supply line 1 of ultrapure water W, a platinum group metal carrying resin column 2, a membrane-type deaeration apparatus 3, and a gas dissolving membrane apparatus 4, and a washing chemical solution injection apparatus 5 is provided between the platinum group metal carrying resin column 2 and the membrane-type deaeration apparatus 3. An inert gas source 6 is connected to a gas phase side of the membrane-type deaeration apparatus 3, and an inert gas source 7 is also connected to a gas phase side of the gas dissolving membrane apparatus 4. A discharge line 8 communicates with the gas dissolving membrane apparatus 4. In FIG. 1, reference numeral 9 denotes a drain tank for the membrane-type deaeration apparatus 3 and the gas dissolving membrane apparatus 4.

<Ultrapure Water>

In this embodiment, suitable ultrapure water W as dilution water has, for example, resistivity: 18.1 MΩ·cm or more, fine particles: 1000/L or less with a particle size of 50 nm or more, viable bacteria: 1/L or less, total organic carbon (TOC): 1 μg/L or less, total silicon: 0.1 g/L or less, metals: 1 ng/L or less, ions: 10 ng/L or less, hydrogen peroxide: 30 μg/L or less, and water temperature: 25±2° C.

<Platinum Group Metal Carrying Resin Column>

(Platinum Group Metal)

In this embodiment, examples of platinum group metal carried by platinum group metal carrying resin used in the platinum group metal carrying resin column 2 may include ruthenium, rhodium, palladium, osmium, iridium, and platinum. Among these types of platinum group metal, one type of metal may be used solely, two or more types of metal may be used in combination, two or more types of metal may be used as an alloy, or a refined product of a naturally produced mixture may be used without being separated into simple substances. Among these types of metal, platinum, palladium, or a platinum/palladium alloy solely, or a mixture of two or more of them may be particularly suitably used because they have high catalyst activity.

(Carrier Resin)

In the platinum group metal carrying resin column 2, examples of carrier resin for carrying the platinum group metal may include ion exchange resin. Among them, anion exchange resin may be particularly suitably used. Because of being negatively charged, the platinum group metal is stably carried by the anion exchange resin and hardly peeled. An exchange group of the anion exchange resin is preferably of an OH type. The OH-type anion exchange resin has an alkaline surface and promotes decomposition of hydrogen peroxide.

<Membrane-Type Deaeration Apparatus>

In this embodiment, the membrane-type deaeration apparatus 3 may be used, configured to pass the ultrapure water W into one side (liquid phase side) of a deaeration membrane and exhaust gas from the other side (gas phase side) with a vacuum pump, thereby moving dissolved oxygen through the membrane to the gas phase side and removing the dissolved oxygen. The inert gas source 6 such as a nitrogen source is preferably connected to the vacuum side (gas phase side) of the membrane, thereby improving deaeration performance. The deaeration membrane may be permeable to gas such as oxygen, nitrogen, or steam but impermeable to water, and may be, for example, a silicone rubber membrane, a polytetrafluoroethylene membrane, a polyolefin membrane, a polyurethane membrane, or the like. Various deaeration membranes commercially available may be used.

<Gas Dissolving Membrane Apparatus>

In this embodiment, the gas dissolving membrane apparatus 4 may be configured to pass the ultrapure water W into one side (liquid phase side) of a gas permeable membrane and pass a gas into the other side (gas phase side) to move the gas to the liquid phase side and dissolve the gas, and may use, but not limited to, a membrane of polymer such as polypropylene, polydimethylsiloxane, a polycarbonate-polydimethylsiloxane block copolymer, a polyvinyl phenol-polydimethylsiloxane-polysulfone block copolymer, poly(4-methylpentene-1), poly(2,6-dimethyl phenylene oxide), polytetrafluoroethylene, or the like. The gas to be dissolved in the water is an inert gas such as nitrogen in this embodiment, and the inert gas is supplied from the inert gas source 7.

<Washing Chemical Solution>

In this embodiment, examples of a washing chemical solution to be injected from the washing chemical solution injection apparatus 5 may include, but not limited to, hydrochloric acid, nitric acid, sulfuric acid, hydrofluoric acid, ammonia, or the like.

[Dilute Chemical Solution Producing Method]

Now, a high-purity dilute chemical solution producing method using the dilute chemical solution producing apparatus of this embodiment configured as described above will be described.

First, ultrapure water W for dilution is supplied from the supply line 1 to the platinum group metal carrying resin column 2. In the platinum group metal carrying resin column 2, hydrogen peroxide in the ultrapure water W is decomposed and removed by catalysis of platinum group metal. However, dissolved oxygen in the ultrapure water W is here increased by the decomposition of hydrogen peroxide.

Then, a washing chemical solution is injected from the washing chemical solution injection apparatus 5 to the ultrapure water W to prepare a dilute chemical solution W1. An injection amount (flow rate) of the washing chemical solution may be controlled depending on a flow rate of the ultrapure water W so that the washing chemical solution is diluted to a desired concentration. The dilute chemical solution W1 contains dissolved oxygen in the ultrapure water W and dissolved oxygen brought from the washing chemical solution.

Then, the dilute chemical solution W1 is supplied to the membrane-type deaeration apparatus 3. In the membrane-type deaeration apparatus 3, a liquid phase chamber and a gas phase chamber are defined by a hydrophobic gas permeable membrane, the dilute chemical solution W1 is passed into the liquid phase chamber, and the gas phase chamber is decompressed by a vacuum pump (not shown), thereby moving a dissolved gas such as dissolved oxygen contained in the dilute chemical solution W1 through the hydrophobic gas permeable membrane to the gas phase chamber and thus removing the dissolved gas. At this time, condensed water generated in the gas phase chamber is collected by the drain tank 9. This embodiment is desirable because an inert gas as a sweep gas is supplied from the inert gas source 6 to the gas phase chamber in the membrane-type deaeration apparatus 3 under decompression, thereby increasing a deaeration effect to further increase a dissolved oxygen removing effect of treated water. Examples of the inert gas may include, but not limited to, a noble gas or a nitrogen gas. In particular, nitrogen can be suitably used because of being easily available and inexpensive even at a high-purity level. This can reduce a dissolved oxygen concentration of the dilute chemical solution W1. As such, the washing chemical solution is not directly deaerated, but turned into the dilute chemical solution W1 and then deaerated, thereby reducing risks of leakage of the chemical solution or the like in vacuum deaeration of toxic chemicals.

Then, in this embodiment, the deaerated dilute chemical solution W1 is supplied to the gas dissolving membrane apparatus 4. In the gas dissolving membrane apparatus 4, a liquid phase chamber and a gas phase chamber are defined by a hydrophobic gas permeable membrane, the dilute chemical solution W1 is passed into the liquid phase chamber, and an inert gas is supplied from the inert gas source 7 to the gas phase chamber under the condition that pressure in the gas phase chamber is higher than in the liquid phase chamber, thereby moving the inert gas to the liquid phase chamber to be dissolved in the dilute chemical solution W1, and obtaining a final dilute chemical solution (cleaned dilute chemical solution) W2. At this time, condensed water generated in the gas phase chamber is collected by the drain tank 9. The dissolution of the inert gas can prevent gaseous species from being dissolved again in the cleaned dilute chemical solution W2, thereby maintaining the dilute chemical solution W2 with reduced dissolved oxygen. Examples of the inert gas may include, but not limited to, a noble gas or a nitrogen gas. In particular, nitrogen can be suitably used because of being easily available and inexpensive even at a high-purity level. Such a method using a gas dissolving membrane module allows gas to be easily dissolved in water, and also allows a dissolved gas concentration to be easily adjusted and controlled.

The cleaned dilute chemical solution W2 is supplied to a washing machine for electronic materials such as a semiconductor silicon substrate, a liquid crystal glass substrate, or a photomask quartz substrate. The cleaned dilute chemical solution W2 produced by this embodiment may have, for example, a very low hydrogen peroxide concentration of 1 ppb or less and a very low dissolved oxygen concentration of 100 ppb or less, and is suitable for washing the electronic materials since gaseous species can be prevented from being dissolved again in the dilute chemical solution W2 to maintain the low concentrations.

The present invention has been described with reference to the accompanying drawings. However, the present invention is not limited to the above embodiment, but various changes may be made. For example, a fine particle removing apparatus such as an ultrafiltration membrane may be provided immediately upstream of the washing machine as required. Also, measuring instruments such as a flowmeter, a thermometer, a manometer, or a gas concentration meter may be provided in any places. Further, a chemical solution flow regulating valve may be provided in the washing chemical solution injection apparatus 5, and/or control devices such as a gas flow regulating valve may be provided in the inert gas source 6 and the inert gas source 7, respectively, as required.

EXAMPLE

The present invention will be described in more detail with specific examples provided below.

Example 1

The dilute chemical solution producing apparatus was configured as shown in FIG. 1, ultrapure water W was supplied from the supply line 1 at a flow rate of 0.7 L/min, and passed through the platinum group metal carrying resin column 2 that carries platinum as platinum group metal, and then hydrofluoric acid (having a concentration of 7.5% by weight) as a washing chemical solution was supplied from the chemical solution injection apparatus 5 at a flow rate of 0.05 L/min to prepare a dilute chemical solution W1. The dilute chemical solution W1 was treated by the membrane-type deaeration apparatus 3 and the gas dissolving membrane apparatus 4 to produce a cleaned dilute chemical solution W2. Measurement results of a dissolved oxygen concentration and a dissolved hydrogen peroxide concentration of the cleaned dilute chemical solution W2 are shown in Table 1.

As the membrane-type deaeration apparatus 3, Liqui-Cel (manufactured by Celgard, LLC) was used to pass a nitrogen gas as a sweep gas at a flow rate of 10 L/min. As the gas dissolving membrane apparatus 4, "MHF1704" manufactured by MITSUBISHI RAYON CO., LTD was used to supply a nitrogen gas at a flow rate of 0.1 L/min.

Comparative Example 1

Figure 2:
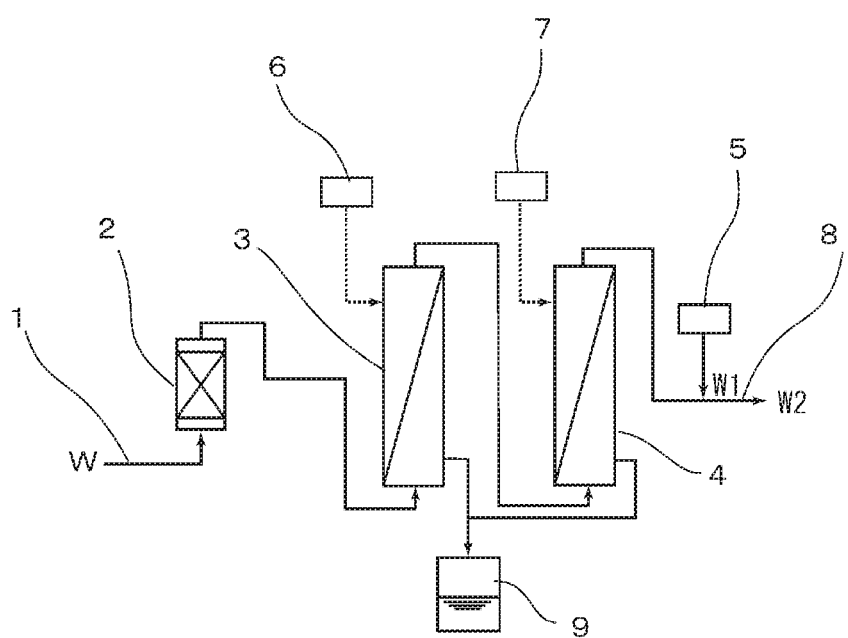
FIG. 2 is a schematic view of a dilute chemical solution producing apparatus according to Comparative example 1.

As shown in FIG. 2, the dilute chemical solution producing apparatus was similarly configured except that the chemical solution injection apparatus 5 was provided downstream of the gas dissolving membrane apparatus 4 in the apparatus in FIG. 1. This dilute chemical solution producing apparatus was used to produce a cleaned dilute chemical solution W2 under the same condition as in Example 1. Measurement results of a dissolved oxygen concentration and a dissolved hydrogen peroxide concentration of the cleaned dilute chemical solution W2 are also shown in Table 1.

TABLE 1

| | Example No. | |
|---|---|---|
| | Example 1 | Comparative example 1 |
| Dissolved oxygen concentration | <100 ppb | >1 ppm |
| Dissolved hydrogen peroxide concentration | <1 ppb | 20 ppb |

As is apparent from Table 1, for the dilute chemical solution producing apparatus of Example 1, the dissolved oxygen concentration was less than 100 ppb and the dissolved hydrogen peroxide concentration was less than 1 ppb and the concentrations were extremely low. On the other hand, for the dilute chemical solution producing apparatus of Comparative example 1, the dissolved oxygen concentration was on the order of ppm, dissolved hydrogen peroxide was contained in a large amount, and particularly, dissolved oxygen that might be an oxidant component was contained in a large amount. This is probably due to dissolved oxygen in hydrofluoric acid supplied from the chemical solution injection apparatus 5.

DESCRIPTION OF REFERENCE NUMERALS

2 platinum group metal carrying resin column
3 membrane-type deaeration apparatus
4 gas dissolving membrane apparatus
5 washing chemical solution injection apparatus
6 inert gas source
7 inert gas source
W ultrapure water
W1 dilute chemical solution
W2 cleaned dilute chemical solution

The invention claimed is:
1. A dilute chemical solution producing apparatus for diluting a chemical solution with ultrapure water, sequentially comprising, in an ultrapure water supply line, a platinum group metal carrying resin column and a membrane-type deaeration apparatus, a chemical solution injection apparatus being provided between the platinum group metal carrying resin column and the membrane-type deaeration apparatus.
2. The dilute chemical solution producing apparatus according to claim 1, wherein an inert gas dissolving membrane apparatus is provided downstream of the membrane-type deaeration apparatus.
3. The dilute chemical solution producing apparatus according to claim 1, wherein the membrane-type deaeration apparatus is of an inert gas suction type.
4. A dilute chemical solution producing method for diluting a chemical solution with ultrapure water, wherein the ultrapure water for dilution is passed through a platinum group metal carrying resin column, then a chemical solution component is added to prepare a dilute chemical solution, and then the obtained dilute chemical solution is deaerated.
5. The dilute chemical solution producing method according to claim 4, wherein an inert gas is dissolved in the deaerated dilute chemical solution.
6. The dilute chemical solution producing method according to claim 4, wherein the deaeration is performed while an inert gas is sucked into a gas phase side.

* * * * *